United States Patent [19]
Leaver

[11] Patent Number: 5,466,993
[45] Date of Patent: Nov. 14, 1995

[54] DEFLECTION APPARATUS FOR RASTER SCANNED CRT DISPLAYS

[75] Inventor: David Leaver, Keymer Hassocks, England

[73] Assignee: International Business Machines Corporation, Armonk, N.Y.

[21] Appl. No.: 214,725

[22] Filed: Mar. 17, 1994

[30] Foreign Application Priority Data

May 26, 1993 [GB] United Kingdom ............ 9310853

[51] Int. Cl.$^6$ .............. H01J 29/70; G09G 1/04
[52] U.S. Cl. .............. 315/411; 315/408; 315/387
[58] Field of Search .............. 315/408, 411, 315/387, 371

[56] References Cited

U.S. PATENT DOCUMENTS

| 4,368,409 | 1/1983 | Sivanesan et al. | 315/411 |
| 4,954,758 | 9/1990 | Rusk | 315/411 |
| 4,956,586 | 9/1990 | Gipson et al. | 315/387 |
| 5,276,604 | 1/1994 | Messman | 315/411 |
| 5,278,764 | 1/1994 | Matsumoto | 315/411 |

Primary Examiner—Gregory C. Issing
Attorney, Agent, or Firm—Martin J. McKinley; Craig J. Yudell; Andrew J. Dillon

[57] ABSTRACT

A deflection apparatus for a raster scanned cathode ray tube display, the apparatus comprising: a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in a deflection coil of the display, the amplitude of the raster scan current signal being determined as a function of the first voltage level and the frequency of the line drive switching signal, and a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the line scan signal to maintain a constant raster line width as the frequency of the line drive signal is varied.

8 Claims, 5 Drawing Sheets

DEFLECTION APPARATUS FOR RASTER SCANNED CRT DISPLAYS

BACKGROUND OF THE INVENTION

1. Technical Field

The present invention relates in general to a CRT display, and in particular to a computer system comprising such a CRT display, together with a processor connected to the CRT display for generating raster synchronization signals and for varying the frequency of at least one of the raster synchronization signals to produce different display modes. More particularly, the present invention relates to a line scan circuit for a CRT display used in such a computer system.

2. Description of the Related Art

The present invention relates to deflection apparatus for a raster scanned CRT display to maintain a constant picture size despite changes in raster line scanning frequency.

Many raster scanned CRT displays are now designed to be compatible with a wide range of computer systems each capable of generating one or more different raster display formats. Each raster display format is generally characterized by a different pair of line and frame scanning frequencies.

A conventional line scan circuit for driving the horizontal deflection coils for a CRT display comprises a ramp generator for producing a line scan current signal in the deflection coils in synchronization with a raster line synchronization (sync) signal generated by the host computer. The line scan signal is generally in the form of a sawtooth waveform. However, to bring the angular velocity into line with the arc of the CRT screen to ensure that the or each electron beam tracks each line of the raster with constant velocity, a degree of "S correction" is applied to the line scan signal. The degree of "S correction is determined by an S correction capacitance conventionally connected in series with the deflection coils.

The amplitude of the line scan signal is inversely proportional to the frequency of the line sync signal. Therefore, the width of the picture displayed on the CRT screen is inversely proportional to the frequency of the line sync signal.

Typically, in CRT displays that are capable of displaying different raster display formats, a ramp regulator is connected to the ramp generator to reduce the effect of changes in line sync frequency on displayed picture width by varying the amplitude of the line scan signal as a function of a reference input and a feedback signal. The feedback signal is generated as a function of the line scan signal by a feedback circuit connected to the ramp generator and the regulator.

In some conventional CRT displays, the ramp regulator is configured to operate only within discrete bands of line sync frequencies each centered on a different commonly-used line sync frequency. Each band is separated from adjacent bands by a dead band. The dead bands prevent the ramp regulator from spuriously toggling between adjacent bands.

A disadvantage associated with displays having banded width regulation is that they cannot operate at line sync frequencies within the dead bands. Furthermore, complex switching circuitry is required to implement banded width regulation. Thus, displays having banded width regulation contain a large number of components and are consequently expensive to manufacture.

SUMMARY OF THE INVENTION

It is therefore an object of the present invention to provide a simple and therefore inexpensive deflection circuit which is capable of operating over a wide range of frequencies without dead bands.

It is another object of the present invention to provide a simple and therefore inexpensive EHT generator which is capable of operating over a wide range of frequencies without dead bands.

It is yet another object of the present invention to provide a deflection apparatus for a raster scanned CRT display that maintains a constant picture size despite changes in raster line scanning frequency.

The foregoing objects are achieved as is now described. In accordance with the present invention, there is now provided a deflection apparatus for a raster scanned cathode ray tube display, the apparatus comprising: a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in a deflection coil of the display, the amplitude of the raster scan current signal being determined as a function of the first voltage level and the frequency of the line drive switching signal, and a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the line scan signal to maintain a constant raster line width as the frequency of the line drive signal is varied.

In a preferred embodiment of the present invention, the deflection apparatus is further simplified by including the raster deflection coil in the first inductor.

In a particularly preferred embodiment of the present invention, the boost circuit comprises an S correction capacitor for providing S correction to the scan current signal. This alleviates the requirement for a conventional S correction capacitor at the output of the ramp generator and thus provides a further circuit simplification.

The regulator is preferably adapted to vary the width of the pulses of the pulse signal as a function of an East-West pin cushion distortion correction signal. The regulator can also be adapted to provide for width adjustment and presetting.

Viewing a second aspect of the present invention, there is now provided apparatus for generating an anode voltage for a CRT display, the generator comprising: a flyback circuit including a transformer having a primary winding connected in series with a first transistor switch, the first transistor switch being responsive to a line drive signal to alternately open and close a current path through the primary winding between a first voltage level and a second voltage level lower than the first voltage level to generate a voltage impulse signal across the primary winding, the amplitude of the voltage impulse signal being determined as a function of the first voltage level and the frequency of the line drive switching signal, and a boost circuit connected to the flyback circuit, the boost circuit comprising an inductor connected in series with a second transistor switch, the second transistor switch being responsive to a pulse signal synchronized to the line drive signal to alternately open and close a current path through the inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the voltage impulse signal to maintain a constant anode voltage as the frequency of the line drive signal is varied.

In preferred embodiments of the present invention, the regulator comprises: a feedback circuit connected to the flyback circuit for generating a feedback signal as a function of the amplitude of the voltage impulse signal; an error amplifier connected to the feedback circuit for generating an error signal as a function of the difference between the feedback signal and a reference level, and a pulse width modulator connected to the error amplifier and the boost circuit for modulating the width of the pulse signal as a function of the error signal.

The pulse width modulator comprises: a current sensor connected to the boost circuit for generating a ramp signal as a function of current flowing in the second current path; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
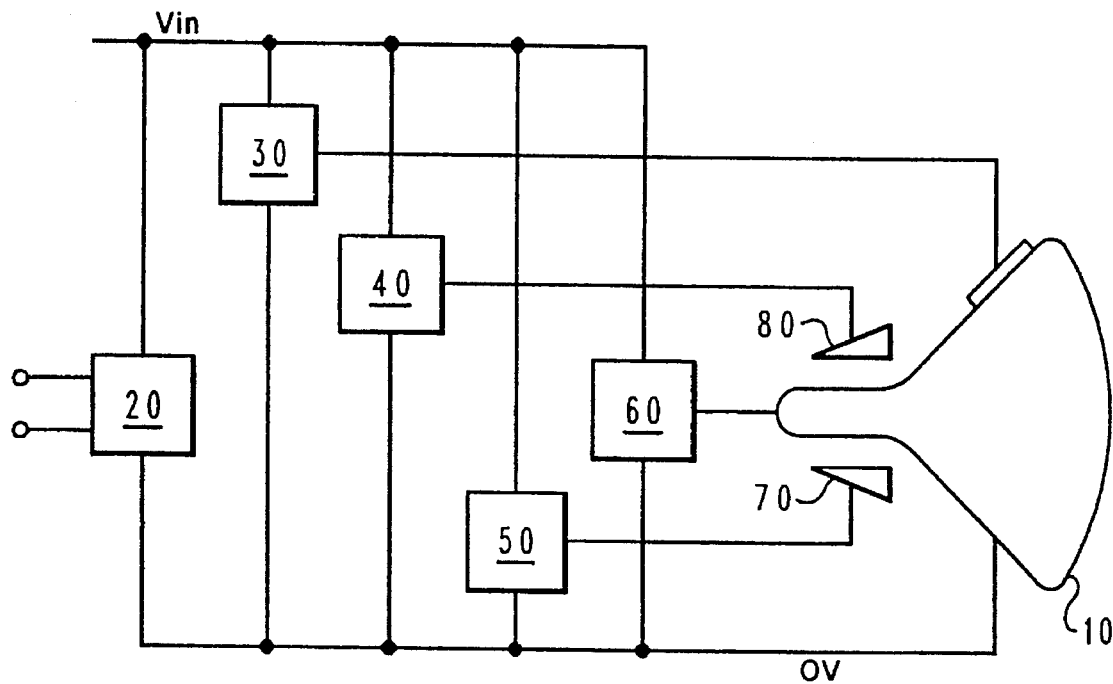
FIG. 1 is a block diagram of a CRT display.

Referring first to FIG. 1, a CRT display comprises a Cathode Ray Tube (CRT) 10 connected to an Extra High Tension voltage (EHT) generator 30 and a video amplifier 60. Line and frame deflection coils, 80 and 70 respectively, are disposed around the neck of the CRT 10. Deflection coils 80 and 70 are connected to line and frame scan circuits, 40 and 50, respectively. A power supply 20 is connected via power supply rails to the EHT generator 30, video amplifier 60 and scan circuits 40 and 50.

In operation, EHT generator 30 generates an electric field within CRT 10 for accelerating electrons in beams towards the screen of CRT 10. Line and frame scan circuits 40 and 50 generate line and frame scan currents in deflection coils 70 and 80. The line and frame scan currents are in the form of ramp signals to produce time-varying magnetic fields that scan the electron beams across CRT screen 10 in a raster pattern. The line and frame scan signals are synchronized by line and frame scan circuits 40 and 50 to input line and frame sync signals generated by a host computer system (not shown). Video amplifier 60 modulates the electron beams to produce an output display on CRT 10 as a function of input video signals also generated by the host computer system.

Figure 2:
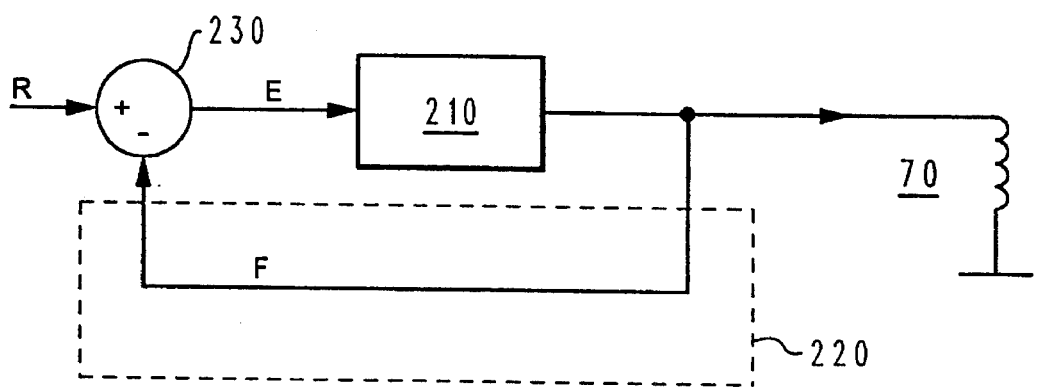
FIG. 2 is a block diagram of a line scan circuit for the CRT display.

Referring now to FIG. 2, conventional line scan circuit 40, for a CRT display that is capable of displaying different raster display formats, comprises a ramp generator 210 connected to horizontal deflection coils 70. A ramp regulator 230 is connected to the ramp generator. The output of the ramp generator is connected to the input of the ramp regulator 230 via a feedback circuit 220.

In operation, ramp generator 210 produces a line scan current signal in deflection coils 70. The line scan current signal is synchronized to the line sync signal from the host computer. Ramp regulator 230 generates an error signal for controlling the amplitude of the line scan current signal and therefore width of picture displayed on CRT 10. The picture width can be adjusted by adjusting a reference input value R. Feedback circuit 220 provides a feedback signal F derived from the line scan current signal to ramp regulator. Error signal E is determined by ramp regulator 230 as a function of the difference between reference value R and feedback signal F. Ramp generator 210, ramp regulator 230, and feedback circuit 220 therefore constitute a negative feedback control loop that operates to maintain the width of the picture displayed on the CRT constant despite changes in the horizontal scan frequency.

Figure 3:
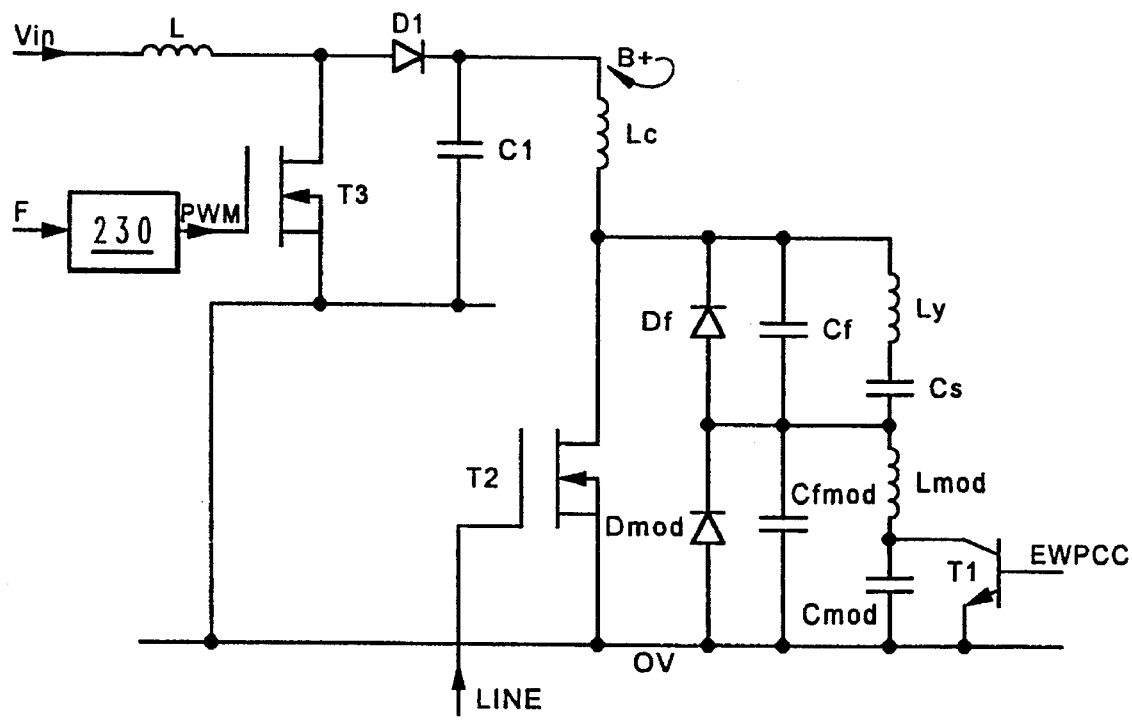
FIG. 3 is a circuit diagram of a ramp generator of the present invention.

Referring now to FIG. 3, in an example of a line scan circuit of the present invention, ramp generator 210 comprises a field effect transistor (FET) T2 having a gate connected at LINE to a line oscillator (not shown) synchronized to the input line sync signal. The drain of T2 is connected to one end of a line choke inductor Lc and the source of T2 is connected to the 0 V supply rail from the power supply. Two diodes, Df and Dmod, are connected in series across the channel of T2. A capacitor Cf is connected across Df, and another capacitor Cfmod is connected across Dmod. The line deflection coils Ly are connected in series with an S correction capacitor Cs across Df. An inductor Lmod is connected in series with a capacitor Cmod across Dmod. The collector-emitter junction of a bipolar transistor T1 is connected across Cmod. The base of T1 is a parabolic signal formed from the frame scan signal. The end of Lc remote from the drain of T2 is connected at node B+ to the cathode of a diode D1. The anode of D1 is connected to the drain of a FET T3. A capacitor C1 is connected between the cathode of D1 and 0 V. The source of T3 is connected to 0 V. The drain of T3 is connected, via an inductor LL, to a high voltage power supply rail Vin. The gate of T3 is connected to a Pulse Width Modulated (PWM) square wave output from ramp regulator 230. A preferred example of ramp regulator 230 will be described later with reference to FIG. 6.

In operation, T2, Lc, Df, and Cf collectively form a flyback circuit for generating a ramp current signal in deflection coils Ly. The operation of flyback circuits is well known in the art of electronic circuit design and therefore will not be discussed in detail herein. Briefly, as T2 is alternately turned on and off, electrical energy is alternately stored in Lc and Cf. The line scan current signal is produced by the energy transfer. The peak to peak amplitude of the line scan signal, and therefore the width of the picture displayed on the CRT screen is a function of the voltage across Lc, ie: the voltage at node $B^+$. Dmod, Cfmod, Lmod, Cmod, and T1 collectively form a diode modulator for modulating the line scan signal with an east west pincushion distortion correction (EWPCC) signal to reduce east-west pin-cushion distortion of the raster. The EWPCC signal is in the form of a parabola derived from the frame scan ramp signal.

In accordance with the present invention, the voltage at node B+ is controlled by a boost circuit formed by T3, C1, D1 and L. The pulse width of the PWM signal at the base of T3, together with the voltage Vin, determine the voltage at $B^+$. The voltage at $B^+$ can therefore be varied by varying the pulse width of the PWM signal at the base of T3 to vary the amplitude of the line scan signal, and therefore the picture width, at a particular line sync frequency or, more importantly, to maintain the picture width constant despite changes in line sync frequency over a broad frequency range.

Figure 4:
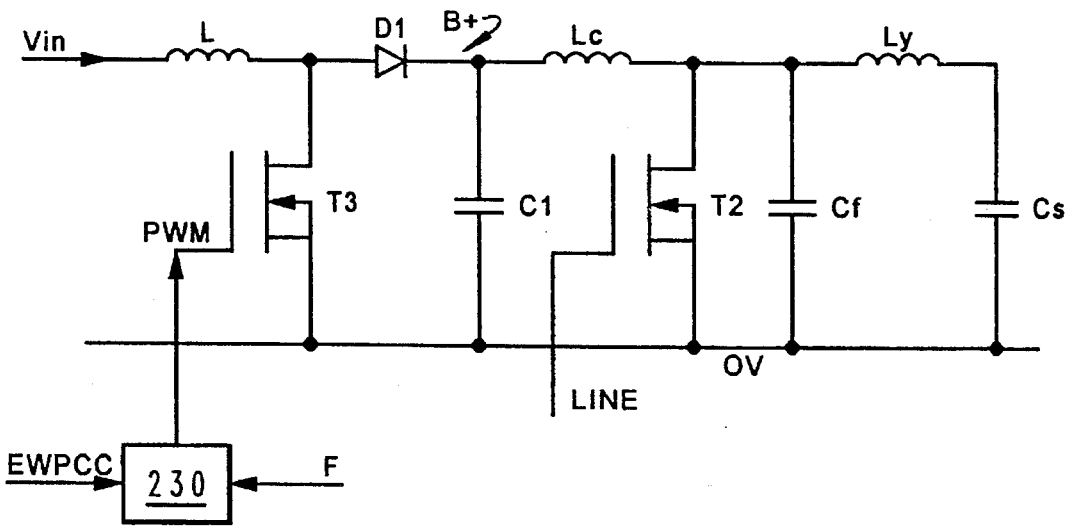
FIG. 4 is a circuit diagram of another ramp generator of the present invention.

In accordance with a preferred feature of the present invention, by varying the voltage at node B as a function of the EWPCC signal, the ramp generator of the present invention can be simplified because Lmod, Cmod, T1, Dmod, and Cfmod are no longer required and can therefore be removed. For example, referring now to FIG. 4, in a preferred modification of the ramp generator shown in FIG. 3, both picture width regulation and East-West pin-cushion correction are provided by varying the voltage at node B. Specifically, ramp regulator 230 modulates the PWM signal at the gate of T3 as a function of the parabolic EWPCC signal. This preferred feature of the present invention permits simplification of the ramp generator of FIG. 3 as Cmod, T1, Dmod and Cfmod are no longer required.

Figure 5:
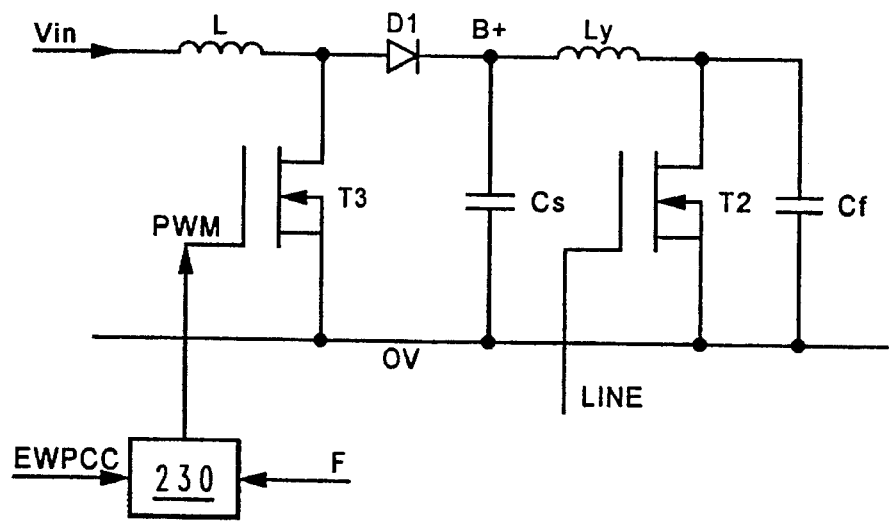
FIG. 5 is a circuit diagram of yet another ramp generator of the present invention.

In operation, choke Lc isolates the voltage at node $B^+$ from high voltage flyback pulses (typically 1.2 kV peak) on the drain of T2. However, the voltage across Cs is substantially the same as that at node $B^+$. Thus, in accordance with another preferred feature of the present invention, line choke Lc can be replaced by deflection coils Ly. In this arrangement of the present invention, capacitor C1 of the boost circuit can additionally act as the S correction capacitor, leading to a further simplification of the ramp generator of the present invention. For example, referring to FIG. 5, in a preferred modification of the ramp generator shown in FIG. 4, yoke Ly is connected between node B and the drain of T2 and S correction capacitor Cs is connected between node B and 0 V.

In conventional line scan circuits, ramp regulator 230 regulates picture width as a function of voltage feedback from the output of the ramp generator alone. However, such regulators do not generally exhibit good transient response, as will now be explained with reference back to FIG. 3. When T3 turns on, current begins to flow in inductor L and a magnetic field is thus established. However, no current flows in the flyback circuit as a result of this current. Feedback signal F alone is returned from the ramp generator to determine the on time of T3. However, feedback signal F is derived from the line scan signal during the previous cycle. In other words, feedback signal F corresponds to the previous line scan period. T3 is turned off and the collapsing field around inductor L causes current flow via D1 into the flyback circuit. The cycle then repeats. Thus feedback signal F always lags by one line period. It will however be appreciated that the regulator may take two or more line periods to recover from a step input. Error signal E will thus exist for at least one line period. Thus, if the reference input R changes, or the line frequency changes, or at worst case both change simultaneously, the recovery time may be sufficiently long to damage the ramp generator.

In accordance with the present invention, the problem of recovery time associated with conventional ramp regulators is solved by partially replacing voltage feedback from the ramp generator with current feedback.

Figure 6:
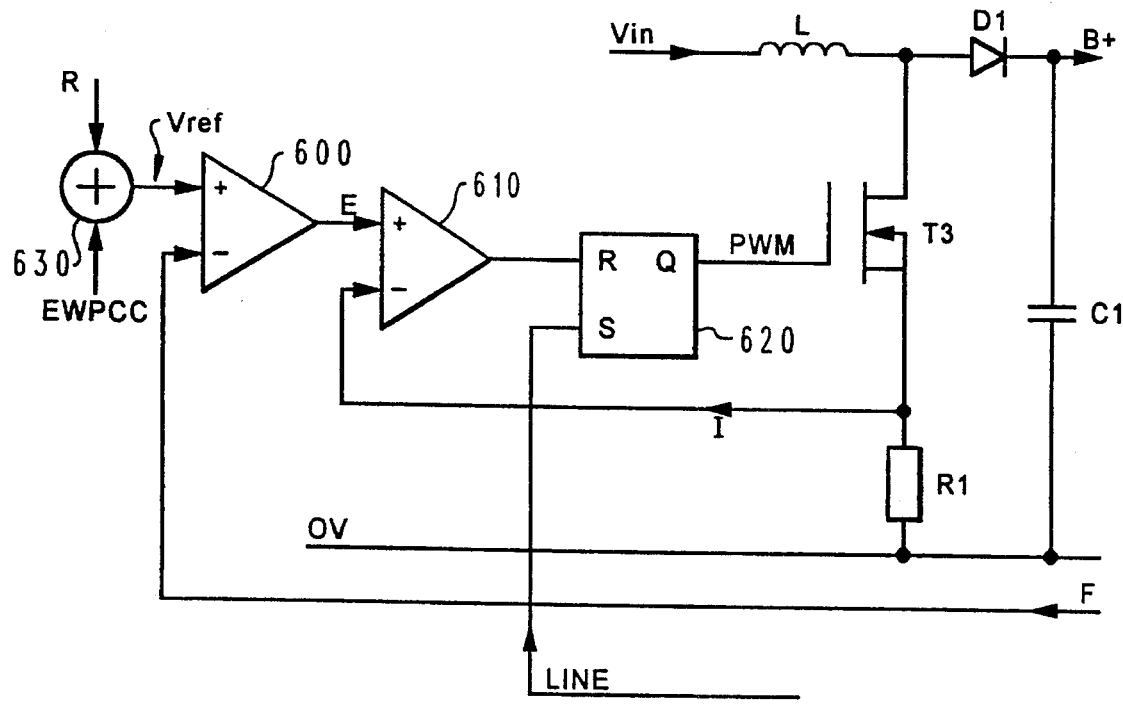
FIG. 6 is a circuit diagram of a ramp regulator of the present invention.

Referring now to FIG. 6, in a preferred example of a line scan circuit of the present invention, ramp regulator 230 comprises a Set-Reset (SR) latch 620. The output Q of SR latch 620 is coupled to the gate of T3. A resistor R1 is connected between the source of T3 and 0 V. The Set input S of SR latch 620 is connected to the line drive signal LINE. The Reset input of SR latch 620 is connected to the output of a comparator 610. The negative input of comparator 610 is connected via feedback loop I to the source of the T3, and the positive input of comparator 610 is connected to the output of a difference amplifier 600. The positive input to amplifier 600 is connected to a reference voltage level Vref. A summing junction 630 determines Vref as the sum of reference input R and East-West pincushion distortion signal EWPCC. The negative input of the comparator is connected via the feedback loop F (see FIG. 2) to the output of the ramp generator (drain of T2 in FIGS. 3, 4, and 5).

In operation, at initial turn on, output Q of SR latch 620 is low. Therefore, T3 is turned off. As input S of latch 620 goes high on the rising edge of line drive signal LINE, output Q goes high. Therefore, T3 turns on. The current through L and the channel of T3 therefore increases linearly. Thus, the voltage across R1, and hence the voltage at the negative input of comparator 610, increases linearly. When the voltage on the negative input of comparator 610 reaches the voltage on the positive input of comparator 610, the output of comparator 610 goes high. Therefore, the Reset input of latch 620 goes high. The output of latch 620 thus goes low and T3 turns off. When T3 turns off, the voltage across R1 goes back to 0 V. The voltage on the positive input of comparator 610 is determined by amplifier 600 as a function of the difference between the reference voltage level on the positive input of comparator 600 and the feedback signal on the negative input of comparator 600.

Examples of deflection apparatus of the present invention have now been described. From the following, it will be appreciated that the present invention is equally applicable to EHT generator 30. It will also be appreciated from the following the present invention is particularly advantageous where the EHT generator 30 comprises a regulator to compensate the generated EHT for changes in line scan frequency. Conventional EHT regulators have the same problem of recovery time occurring in the conventional ramp regulators hereinbefore mentioned. In accordance with the present invention, the problem of recovery time associated with conventional EHT regulators is solved by partially replacing voltage feedback from the ramp generator with current feedback.

Figure 7:
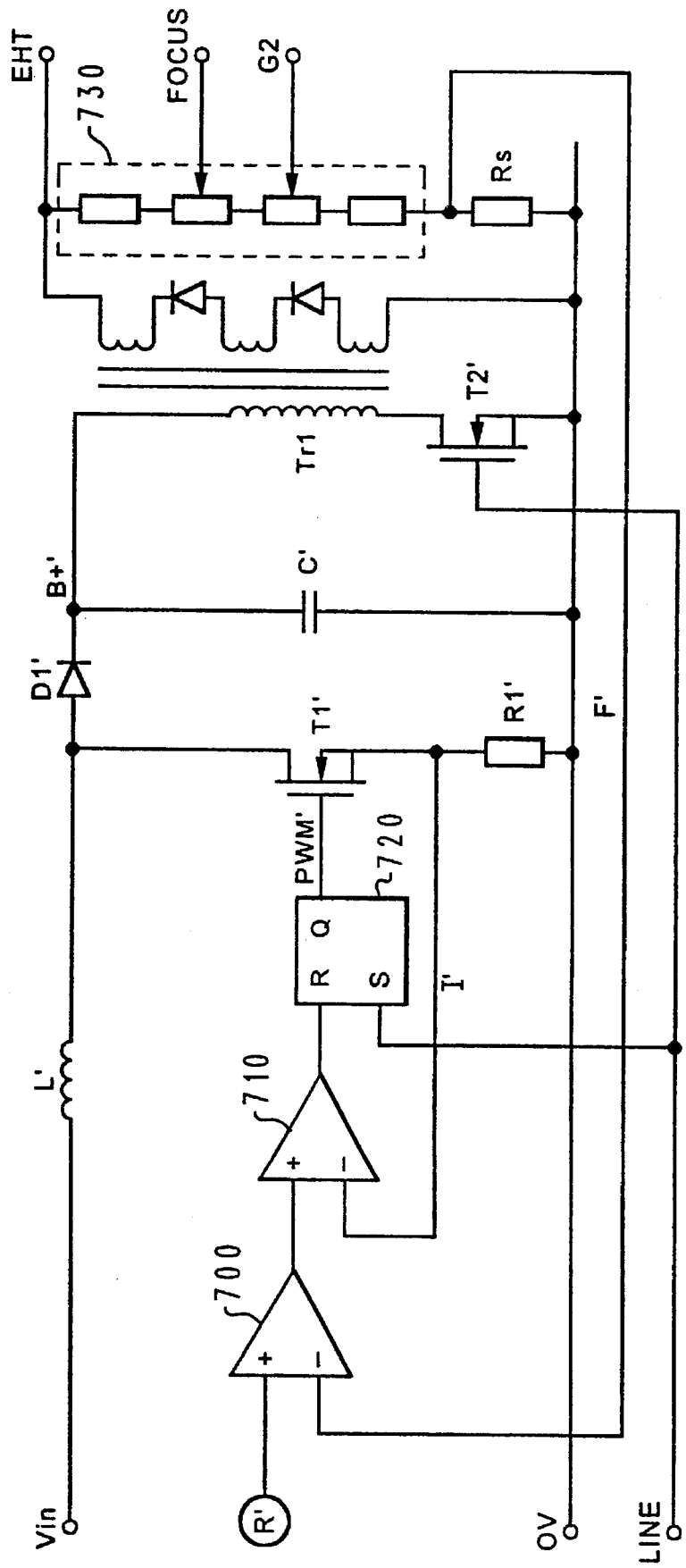
FIG. 7 is a circuit diagram of an Extra High Tension generator of the present invention.

Referring now to FIG. 7, an example of an EHT generator 30 of the present invention comprises a field effect transistor (FET) T2' having a gate connected at LINE to the line oscillator (not shown) synchronized to the input line sync signal. The drain of T2' is connected to one end of the primary winding of a step up transformer Tr1 and the source of T2' is connected to the 0 V supply rail. The end of Tr1 remote from the drain of T2' is connected at node B+' to the cathode of a diode D1'. The anode of D1' is connected to the drain of a FET T1'. A capacitor C' is connected between the cathode of D1' and 0 V. The source of T1' is connected to 0 V. The drain of T1' is also connected, via an inductor L1' to the high voltage power supply rail Vin. The gate of T1' is connected to the output Q of an SR latch 720. In operation, SR latch 720 generates a PWM signal for switching T1' as will be described shortly.

In operation, T2', and Tr1, primary winding, collectively form a flyback circuit for generating a peak voltage signal across the primary winding of Tr1. The secondary winding of Tr1 steps up the peak voltage signal to produce the EHT voltage applied to the final anode of CRT 10. A potential divider 730 is connected across the secondary winding of Tr1 to produce G2 and focus voltages for respectively driving accelerating and focus electrodes of CRT 10. The peak amplitude on across the primary winding of Tr1, and therefore the level of the EHT voltage is a function of the DC voltage across the primary winding of Tr1, ie: the voltage at node B+'.

In accordance with the present invention, the voltage at node B+' is controlled by a boost circuit formed by T1', C', D1' and Tr1, primary winding. The pulse width of a PWM signal (PWM') at the base of T1', together with the voltage Vin, determine the voltage at B+'. The voltage at B+' can therefore be varied by varying the pulse width of the PWM signal at the base of T1' to vary the EHT voltage, at a particular line sync frequency or, more importantly, to maintain a constant EHT voltage despite changes in line sync frequency over a broad frequency range.

As mentioned earlier, the output Q of SR latch 720 is coupled to the gate of T1'. A resistor R1' is connected between the source of T1' and 0 V. The Set input S of SR latch 720 is connected to the line drive signal LINE. The Reset input of SR latch 720 is connected to the output of a comparator 710. The negative input of comparator 710 is connected via feedback loop I' to the source of the T1', and the positive input of comparator 710 is connected to the output of a difference amplifier 710. The positive input to amplifier 700 is connected to a reference voltage level R'. The negative input of the amplifier 700 is connected via a feedback loop F' to a sense voltage measured across a sense resistor Rs connected in series with potential divider 730. The sense voltage is proportional to the EHT voltage.

In operation, SR latch 720, comparator 710, amplifier 700, and feedback loops I' and F' collectively for an EHT regulator for regulating the EHT voltage. At initial turn on, output Q of SR latch 720 is low. Therefore, T1' is turned off. As input S of latch 720 goes high on the rising edge of line drive signal LINE, output Q goes high. Therefore, T1' turns on. The current through L' and the channel of T1' therefore increases linearly. Thus, the voltage across R1', and hence the voltage at the negative input of comparator 710, increases linearly. When the voltage on the negative input of comparator 710 reaches the voltage on the positive input of comparator 710, the output of comparator 710 goes high. Therefore, the Reset input of latch 720 goes high. The output of latch 720 thus goes low and T1' turns off. When T1' turns off, the voltage across R1' drops back to 0 V. The voltage on the positive input of comparator 710 is determined by amplifier 700 as a function of the difference between the reference voltage level R' on the positive input of amplifier 700 and the feedback signal on the negative input of amplifier 700.

Figure 8:
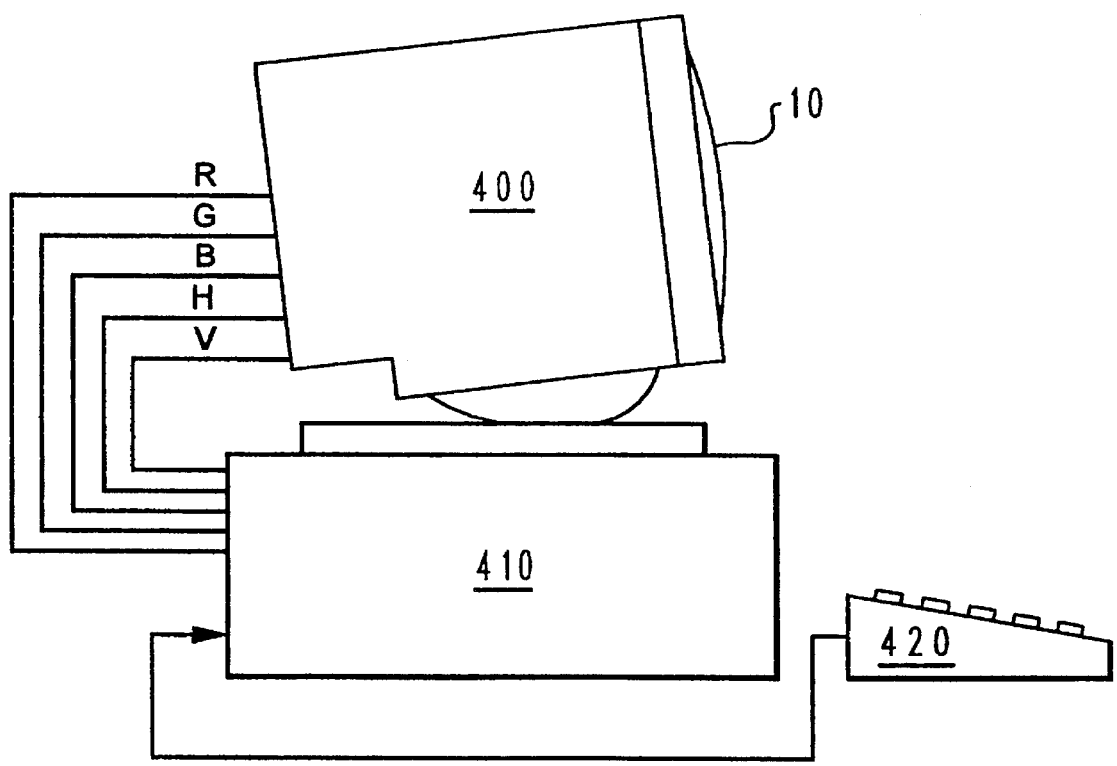
FIG. 8 is a side view of a computer system comprising a CRT display of the present invention.

FIG. 8 shows a computer system including a CRT display 400 comprising a line scan circuit of the present invention. The computer system comprises a processor 410 connected to the CRT display 400 and to an input device 420 such as keyboard 420. The processor may be in the form of a microcomputer such as an IBM Personal System/2 Model 70 microcomputer (Personal System/2 is a trademark of International Business Machines Corporation) or a mainframe computer. In operation, the CRT display generates a picture in response to Red, Green and Blue, R, G and B, video signals and line and frame, H and V, sync signals generated by the processor. The processor configures the CRT display to operate in different display modes by varying the frequency of one or more of the sync signals. However, in accordance with the present invention, the size of the picture displayed by the CRT display is maintained substantially constant between the different display modes.

While the invention has been particularly shown and described with reference to a preferred embodiment, it will be understood by those skilled in the art that various changes in form and detail may be made therein without departing from the spirit and scope of the invention.

What is claimed is:

1. A deflection apparatus for a raster scanned cathode ray tube display, the apparatus comprising:

a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in a raster deflection coil of the display, the amplitude of the raster scan current signal being determined as a function of the first voltage level and the frequency of the line drive signal;

a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the raster scan current signal to maintain a constant raster line width as the frequency of the line drive signal is varied, wherein the regulator includes a feedback circuit connected to the flyback circuit for generating a feedback signal as a function of the amplitude of the raster scan current signal, an error amplifier connected to the feedback circuit for generating an error signal as a function of the difference between the feedback signal and a reference level, and a pulse width modulator connected to the error amplifier and the boost circuit for modulating the width of the pulse signal as a function of the error signal, wherein the pulse width modulator includes a current sensor connected to the boost circuit for generating a ramp signal as a function of current flowing in the current path through the second inductor; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator.

2. An apparatus as claimed in claim 1, wherein the first and second transistor switches each comprise a field effect transistor.

3. An apparatus as claimed in claim 1, wherein the regulator is adapted to vary the width of the pulses of the pulse signal as a function of an East-West pin cushion distortion correction signal.

4. A deflection apparatus for a raster scanned cathode ray tube display, the apparatus comprising:

a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in the first inductor, the amplitude of the raster scan current signal being determined as a function of the first voltage level and the frequency of the line drive switching signal;

a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the line scan signal to maintain a constant raster line width as the frequency of the line drive signal is varied.

5. An apparatus as claimed in claim 4, wherein the boost circuit includes an S correction capacitor connected between the first voltage level and the second voltage level.

6. An apparatus for generating an anode voltage for a CRT display, the generator comprising: a flyback circuit including a transformer having a primary winding connected in series with a first transistor switch, the first transistor switch being responsive to a line drive switching signal to alternately open and close a current path through the primary winding between a first voltage level and a second voltage level lower than the first voltage level to generate a voltage impulse signal across the primary winding, the amplitude of the voltage impulse signal being determined as a function of the first voltage level and the frequency of the line drive switching signal;

a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the voltage impulse signal to maintain a constant anode voltage as the frequency of the line drive signal is varied, wherein the regulator comprises: a feedback circuit connected to the flyback circuit for generating a feedback signal as a function of the amplitude of the voltage impulse signal; an error amplifier connected to the feedback circuit for generating an error signal as a function of the difference between the feedback signal and a reference level, and a pulse width modulator connected to the error amplifier and the boost circuit for modulating the width of the pulse signal as a function of the error signal, wherein the pulse width modulator comprises: a current sensor connected to the boost circuit for generating a ramp signal as a function of current flowing in the current path through the second inductor; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator.

7. An apparatus as claimed in claim 6, wherein the first and second transistor switches each comprise a field effect transistor.

8. A computer system comprising:

a processor for generating raster synchronization signals and for varying the frequency of at least one of the raster synchronization signals to produce different display modes; and a CRT display connected to the processor for producing a picture on the display in response to the raster synchronization signals and for maintaining the size of the picture substantially constant between the different display modes, wherein the CRT display includes:

a ramp generator having a flyback circuit including a first inductor connected in series with a first transistor switch, the first transistor switch being responsive to a line drive signal to alternately open and close a current path through the first inductor between a first voltage level and a second voltage level lower than the first voltage level to generate a raster scan current signal in a raster deflection coil of the display, the amplitude of the raster scan current signal being determined as a function of the first voltage level and the frequency of the line drive signal;

a boost circuit connected to the flyback circuit, the boost circuit comprising a second inductor connected in series with a second transistor switch, the second transistor switch being responsive to a pulse signal synchronized to the line drive signal to alternately open and close a current path through the second inductor between the second voltage level and a third voltage level higher than the second voltage level to generate the first voltage level, the first voltage level being determined as a function of the third voltage level and the width of the pulses of the pulse signal; and a regulator connected to the flyback circuit and the boost circuit for varying the width of the pulses of the pulse signal as a function of the amplitude of the raster scan current signal to maintain a constant raster line width as the frequency of the line drive signal is varied, wherein the regulator includes a feedback circuit connected to the flyback circuit for generating a feedback signal as a function of the amplitude of the raster scan current signal, an error amplifier connected to the feedback circuit for generating an error signal as a function of the difference between the feedback signal and a reference level, and a pulse width modulator connected to the error amplifier and the boost circuit for modulating the width of the pulse signal as a function of the error signal, wherein the pulse width modulator includes a current sensor connected to the boost circuit for generating a ramp signal as a function of current flowing in the current path through the second inductor; a comparator connected to the error amplifier for generating an output signal when the ramp signal exceeds the error signal; and a latch connected to the boost circuit and the comparator for generating the pulse signal at the control electrode of the second transistor switch, the latch being set in response to the rising edge of the line drive signal, and the latch being reset in response to the output signal from the comparator.

* * * * *

UNITED STATES PATENT AND TRADEMARK OFFICE
CERTIFICATE OF CORRECTION

PATENT NO.  :  5,466,993
DATED       :  November 14, 1995
INVENTOR(S) :  Leaver

It is certified that error appears in the above-indentified patent and that said Letters Patent is hereby corrected as shown below:

Column 4, line 64:  change "LL" to --L--

Column 5, line 58:  change "O V" to --OV--

Column 7, line 11:  change "L1'" to --L'--

Signed and Sealed this

Thirteenth Day of August, 1996

Attest:

BRUCE LEHMAN

*Attesting Officer*     *Commissioner of Patents and Trademarks*